United States Patent [19]

Bohlen et al.

[11] Patent Number: 4,513,203
[45] Date of Patent: Apr. 23, 1985

[54] MASK AND SYSTEM FOR MUTUALLY ALIGNING OBJECTS IN RAY EXPOSURE SYSTEMS

[75] Inventors: Harald Bohlen, Böblingen; Helmut Engelke, Altdorf; Johann Greschner, Pliezhausen; Reinhold Mühl, Altdorf; Peter Nehmiz; Hans J. Trumpp, both of Stuttgart, all of Fed. Rep. of Germany

[73] Assignee: International Business Machines Corporation, Armonk, N.Y.

[21] Appl. No.: 625,586

[22] Filed: Jun. 29, 1984

Related U.S. Application Data

[63] Continuation of Ser. No. 381,666, May 24, 1982, abandoned.

[30] Foreign Application Priority Data

May 30, 1981 [DE] Fed. Rep. of Germany ....... 3121666

[51] Int. Cl.³ ...................... G01N 21/00; G01N 23/00
[52] U.S. Cl. ..................................... 250/491.1; 378/34
[58] Field of Search ..................... 250/397, 398, 491.1, 250/492.2; 378/34

[56] References Cited

U.S. PATENT DOCUMENTS

| | | | |
|---|---|---|---|
| 3,326,176 | 6/1967 | Sibley | 118/6 |
| 3,745,358 | 7/1973 | Firtz et al. | 250/397 |
| 3,843,916 | 10/1974 | Trotel et al. | 250/492.2 |
| 4,085,329 | 4/1978 | McCoy et al. | 250/492.2 |
| 4,151,420 | 4/1979 | Keller et al. | 250/492.2 |
| 4,158,141 | 6/1979 | Seliger et al. | 250/492.2 |
| 4,327,292 | 4/1982 | Wang et al. | 250/492.2 |
| 4,370,554 | 1/1983 | Bohlen et al. | 250/491.1 |

FOREIGN PATENT DOCUMENTS

| | | |
|---|---|---|
| 0009562A1 | 4/1980 | European Pat. Off. . |
| 0027497A3 | 4/1981 | European Pat. Off. . |
| 0043863A1 | 1/1982 | European Pat. Off. . |
| 2702444A1 | 7/1978 | Fed. Rep. of Germany . |
| 2722958A1 | 11/1978 | Fed. Rep. of Germany . |
| 2739502A1 | 3/1979 | Fed. Rep. of Germany . |

OTHER PUBLICATIONS

Spears et al., "X-Ray Lithography—A New High Resolution Replication Process", Solid State Technology, Jul. 1972, vol. 15/No. 7, pp. 21–26.

W. R. Livesay, "Computer Controlled Electron-Beam Projection Mask Aligner", Solid State Technology, Jul. 1974, vol. 17/No. 7, pp. 21–26.

*Primary Examiner*—Bruce C. Anderson
*Attorney, Agent, or Firm*—Graham S. Jones, II

[57] ABSTRACT

For mutually aligning (registering) mask and substrate in X- or corpuscular ray lithography, an electron beam (16) is used which extends collaterally to the exposure beam (ion beam or X-ray) and which is suppressed during the actual exposure process. For coupling the electron beam to the exposure beam path, a magnetic field (7) is used. The accurate relative position of mask and substrate is determined during alignment by tilting the electron beam. Fine alignment during exposure is effected by suitably tilting the ion beam or shifting the substrate relative to the X-ray. The mask (10) used for exposure consists of a very thin silicon layer with a pattern area (M) and a registration area (R) spatially separated therefrom. The registration area consists of a plurality of openings, the pattern area of blind holes.

23 Claims, 13 Drawing Figures

MASK AND SYSTEM FOR MUTUALLY ALIGNING OBJECTS IN RAY EXPOSURE SYSTEMS

This is a continuation of application Ser. No. 06/386,666 filed May 24, 1982 abandoned.

TECHNICAL FIELD

The invention concerns a method for mutually aligning objects in X- and corpuscular ray lithography according to the method for mutually aligning (registering) objects in X or corpuscular ray exposure processes and an arrangement for implementing the method.

BACKGROUND ART

The progressive reduction of the dimensions in photolithographic manufacturing processes, in particular for integrated semiconductor circuits, is approaching its physical limits whenever the structures to be imaged are of the order of the light wavelength used and the resolution is confined by diffraction effects.

Therefore, corpuscular or X-rays, which correspond to much shorter wavelengths, have been considered for submicron lithography. Of these alternative methods, electron beam lithography with controlled beam deflection has been developed furthest. But with the latter type of method the time required for writing increases considerably as the structures are becoming smaller. This disadvantage is eliminated by projection methods, wherein masks are imaged, as, for example, in the case of the electron beam projection printing method according to the German Offenlegungsschrift No. OS 27 39 502. However, the resolution of all electron beam methods is generally limited by the so-called proximity effect which by scattering the electrons in the photoresist and the substrate prevents the imaging of very fine pattern elements. Although methods are known for compensating for the proximity effect in electron beam lithography [cf. European Patent Application No. 80103966.0 and the article by M. Parikh in J. Vac. Sci. Techn., Vol. 15, No. 3, (1978), p. 931], the expense involved is relatively great.

With lithographical methods using ion beams or X-rays, the proximity effect is not encountered. Although the minor scattering of these methods permits a high resolution, it is more difficult to align mask and substrate prior to exposure by means of the beams used for exposure. If the ions proper were to be used for alignment (also referred to as registration) they would have to penetrate the photoresist to be scattered at suitably placed registration marks. The scattered ions on their part would have to have sufficient energy to penetrate the photoresist a second time and to exit to the outside, in order to form a detectable signal for registration purposes.

In such circumstances registration signals that can be evaluated are obtained only if the energy chosen for the incident ions is very high or if the photoresist on top of the registration marks is removed. However, one method leads to lattice defects in semiconductors, whereas the other necessitates an additional exposure and development step.

Similar problems resulting from the low radiation density and the limited range also make it impossible with X-ray lithography to receive a registration signal in acceptable times.

Therefore, registration using optical methods has been suggested for the previously proposed ion beam and X-ray lithography systems; examples are described in the articles by B. Fay et al., "Optical alignment system for submicron X-ray lithography" in J. Vac. Sci. Tech., 16 (6), November/December 1979, p. 1954, and R. L. Selinger et al., "Ion beams promise practical systems for submicrometer wafer lithography" in Electronics, Mar. 27, 1980, page 142. However, the use of different types of beams and different beam paths for exposure on the one hand and alignment on the other gives rise to the problem of having to adapt both beam paths to each other and of keeping them constant over longer periods of time. Difficulties may occur in particular when a wafer is successively exposed in several devices of the same type.

DISCLOSURE OF INVENTION

Therefore, it is the object of the present invention to provide a method and an arrangement by means of which two objects for corpuscular or X-ray lithography can be mutually aligned in a simple and largely error-free manner.

According to the teaching of the invention, alignment (registration) in a corpuscular or X-ray exposure system is effected by means of an additional electron beam which is provided only for registration purposes and which extends collaterally to the exposure beam.

An exposure mask, which is particularly favourable for this registration method, comprises at a point outside the actual mask area a special registration pattern consisting of physical holes (openings) in a thin, cantilever membrane.

In accordance with this invention a method is provided for mutually aligning (registering) objects in X- or corpuscular ray exposure processes, characterized in that alignment is effected by means of an electron beam (alignment beam 16) which is blanked during the actual exposure process. Preferably, the electron beam (16) extends collaterally to the exposure beam path (6; 31). Further, for exposing a substrate (wafer 18) through a mask (10) by means of an ion beam (6), which can be tilted about a point lying in the mask plane, the necessary tilting angle is determined during the alignment of the mask and the substrate with the aid of the electron beam and reproduced by the ion beam during the subsequent exposure. Moreover, for exposing a substrate (wafer 18) through a mask (10) by means of X-rays, the correction determined during the alignment of the mask and the substrate is effected by displacing the substrate to be exposed relative to the mask.

An arrangement for implementing the above method employs an ion beam exposure system (FIG. 1). Both the ion beam (6) and the electron beam (16) are introduced into a magnetic field (7) extending perpendicularly to the beam directions, thus being made collateral.

Alternatively, the arrangement comprises an X-ray exposure system (FIG. 3). The electron beam is directed into the axis of the beam of X-rays (31) by a magnetic field (7) extending perpendicularly to the beam direction.

Preferably, the arrangement includes means for checking the collinearity of the exposure and the electron beam. A detector means (23) is provided on top of which a detector mask (22) is arranged which through the mask (10) to be aligned is sequentially subjected to the exposure beam (6; 31) and the electron beam (16).

Further, it is preferred that the arrangement includes an exposure mask (10) consisting of a thin silicon layer (40) and comprises a hole pattern (registration area R), which is separated from the actual pattern area (M), for alignment by the electron beam. The pattern area (M) of the exposure mask (10) consists of blind holes, wherein the detector mask (22) and the registration area (R) of the mask (10) have the same hole pattern.

BRIEF DESCRIPTION OF THE DRAWINGS

Ways of carrying out the invention will be described in detail below with reference to drawings in which.

DESCRIPTION OF THE PREFERRED EMBODIMENT

Figure 1:
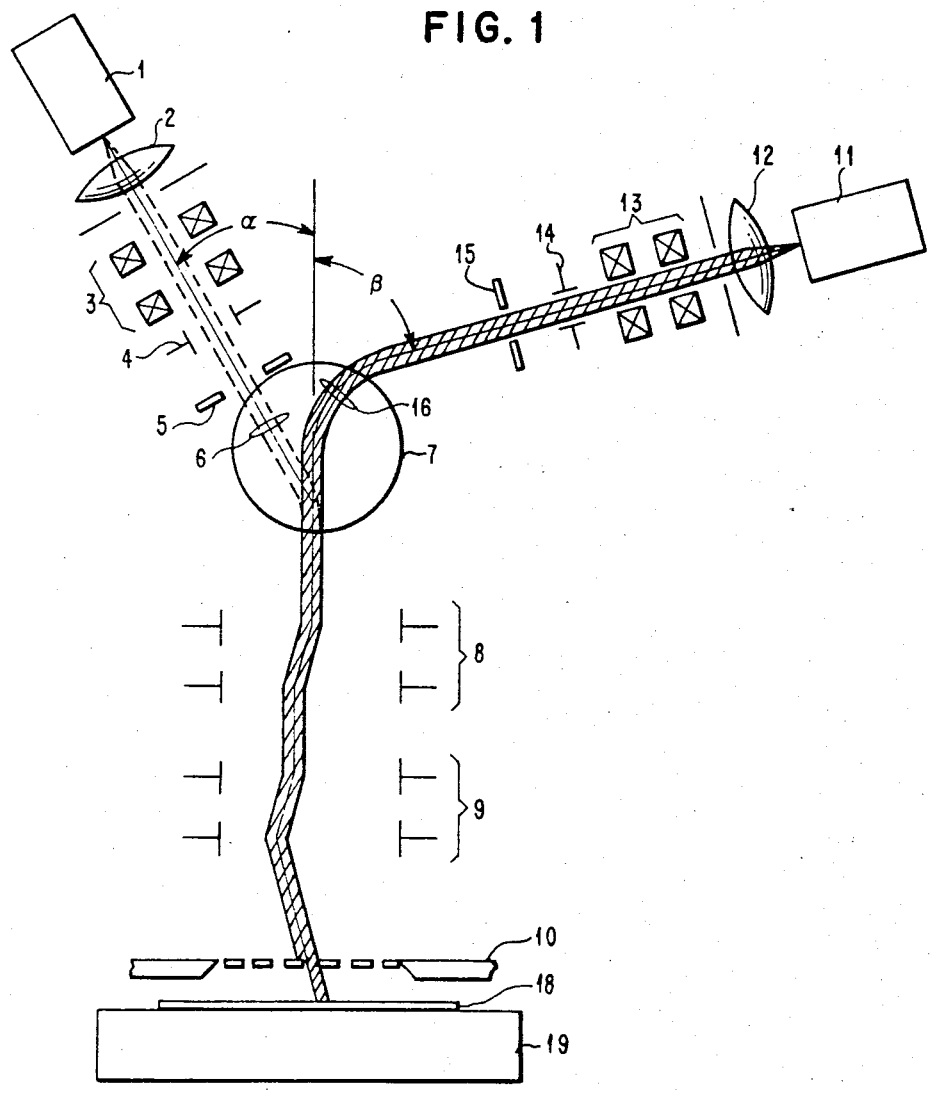
FIG. 1 is an ion beam projection printing device with an electron beam coupled to the exposure beam path and serving to mutually align mask and substrate.

FIG. 1 is a schematic of the design of an ion beam projection printing device with a separate electron beam for aligning (registering) mask and substrate. FIG. 1 shows the state of the device with a switched-on electron beam. The path of the ion beam is marked by broken lines.

The ion beam 6 used to expose a substrate 18 through a mask 10, which is generated in an ion source 1, traverses one or several lenses 2 (e.g., for beam collimation), means 3 for beam alignment (with respect to the beam's position and inclination to the optical axis), blanking electrode plates 4, and a stop diaphragm 5, to be deflected by a magnetic field 7 directed perpendicularly to the plane as drawn in such a manner that it enters the means 8 for scanning (parallel displacement of the ion beam during exposure). Means 8 is followed by a further means 9 tilting the beam about a pivot lying in the mask plane, thus producing fine displacements of the projected image on the wafer. Details of this fine displacement are described in the German Patent Application No. P 29 39 044.1 (European Patent Application No. 80103603.9) which corresponds to U.S. Pat. No. 4,370,554 of Bohlen. The substrate (the wafer) is positioned on an X-Y table 19.

The electron beam 16, provided for the mutual alignment of the mask 10 and the substrate 18, is generated in an electron source 11, traverses, similar to the ion beam 6, a lens 12, a means 13 for beam alignment, blanking electrode plates 14, and a stop diaphragm 15 prior to being deflected in the magnetic field 7 in such a manner that it also vertically enters the deflector means 8. The lenses 2 and 12 are preferably of the electrostatic type, the means 3 and 13 in the example of FIG. 1 are designed as magnetic units, the deflector means 8 and 9 operate according to the electrostatic deflection principle. By means of the blanking electrode plates 4 and 14, respectively, the respective corpuscular rays can be deflected so that they no longer traverse the stop diaphragms 5 and 15, respectively.

As the positively loaded ions and the electrons used in the magnetic field 7 are deflected in opposite directions at different angles, the ion source 1 and the electron source 11 with the connected beam shaping elements have to be arranged so that the beam axes with respect to the vertical include different angles $\alpha$ and $\beta$ ($\alpha < \beta$), respectively. After deflection, the ion beam and the electron beam extend in the same (vertical) direction, so that no parallax error occurs between registration and exposure.

The deflection angle $\alpha$ of a moved charged particle in a magnetic field directed perpendicularly to the trajectory of the particle is $$\tan \alpha = \frac{l \cdot B}{2 \frac{m}{q} U}$$

where
l = distance covered in the magnetic field
B = magnetic flux density
m = mass of particle
q = charge of particle
U = accelerating voltage to which particle has been subjected.

If simply charged lithium ions are used in the ion beam, the tangent of the deflection angle $\alpha$ of the ion beam at the same accelerating voltage is smaller by the factor $$\sqrt{m_{Ion}} / \sqrt{m_{electron}} = 113$$

than for electrons. In such a case, the deflection angle $\alpha$ for the ion beam is, for example, 2°, whereas the deflection angle $\beta$ for the electron beam is 76°.

In order to prevent the electrons and ions from being differently influenced in magnetic fields, the deflector means 8 and 9 operate with electric fields yielding at the same accelerating voltage U the same amount of deflection (but in different directions) for ions and electrons.

During registration, the ion beam 6 is suppressed with the aid of the blanking electrode plates 4, whereas during exposure the electron beam 16 is suppressed with the aid of the blanking electrode plates 14.

After the electron beam 16 has been switched on, registration is effected according to the method described in the above cited Bohem et al German Patent Application No. P 29 39 044.1. The exposure mask 10, which will be described in detail below by means of FIG. 4I, comprises outside the actual pattern area M a registration area R with a plurality of openings by means of which the electron beam is divided into a large number of fine beams. With the aid of fine deflection means 9, these partial beams are jointly deflected across registration marks on the semiconductor wafer 18, whose arrangement corresponds to that of the holes in the mask element R. The registration signal with a high signal-to-noise ratio thus generated indicates positional deviations between mask 10 and wafer 18 which during the subsequent exposure are compensated for by tilting the ion beam 6 by a suitable amount with the aid of deflector means 9. This beam tilting can be effected quickly and thus be repeated several times for the individual areas (e.g., in the case of step-by-step exposure according to the step-and-repeat process).

For measuring the tilting angle for the exposing ion beam with the aid of an electron beam during registration, it is essential that the ion beam 6 and the electron beam 16 have the same beam path. For calibrating these beam paths, a special detector means is provided which will be described by means of FIGS. 2A and 2B.

Figure 2A:
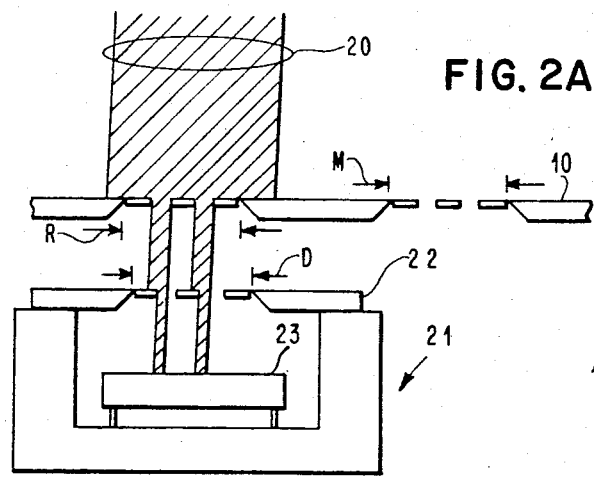
FIG. 2A is a schematic of the exposure mask during alignment.
Figure 2B:
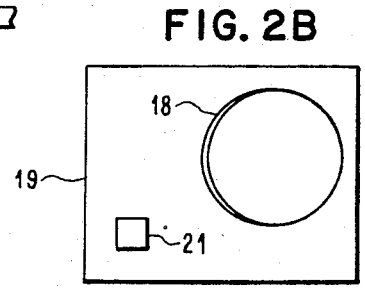
FIG. 2B is a plan view of the X-Y table with wafer and detector means.

In FIG. 2A a calibration means 21 comprises a beam detector means 23 which is responsive to both kinds of beams (ions and electrons and X-rays and electrons, respectively,) used in the lithography systems considered here. Such detector means 23 may be designed to comprise, for example, semiconductor devices whose p-n junctions lie at their very surface. On top of the detector means 23 there is a stationary detector mask 22 with a pattern D of holes which is identical with the hole pattern R for registration in the exposure mask 10. The calibration means 21 is laterally staggered from wafer 18 on the X-Y table 19 (FIG. 2B).

For calibrating the registration and the imaging beam, the calibration means 21 with the X-Y table (cross support) 19 is moved underneath the registration area R of the pattern mask 10. Subsequently, the electron beam 20 is directed onto the area R of the exposure mask 10, and the inclination of the beam is changed until detector means 23 produces a maximum output signal. At the inclination of the beam thus determined the hole pattern of R is imaged on the hole pattern D.

In a second step, the electron beam rather than the ion beam 6 is switched on and also directed as a beam 20 onto the area R of the exposure mask 10. If the ion beam produces the maximum detector signal at another inclination than the electron beam 16 (taking into account the different signs of beam deflection), then there is no optimum alignment of the two beam paths. By changing the beam deflection in means 3 and 13, respectively, for aligning the ion beam 6 and the electron beam 16, the two beam paths can be aligned to each other in a simple manner.

Figure 3:
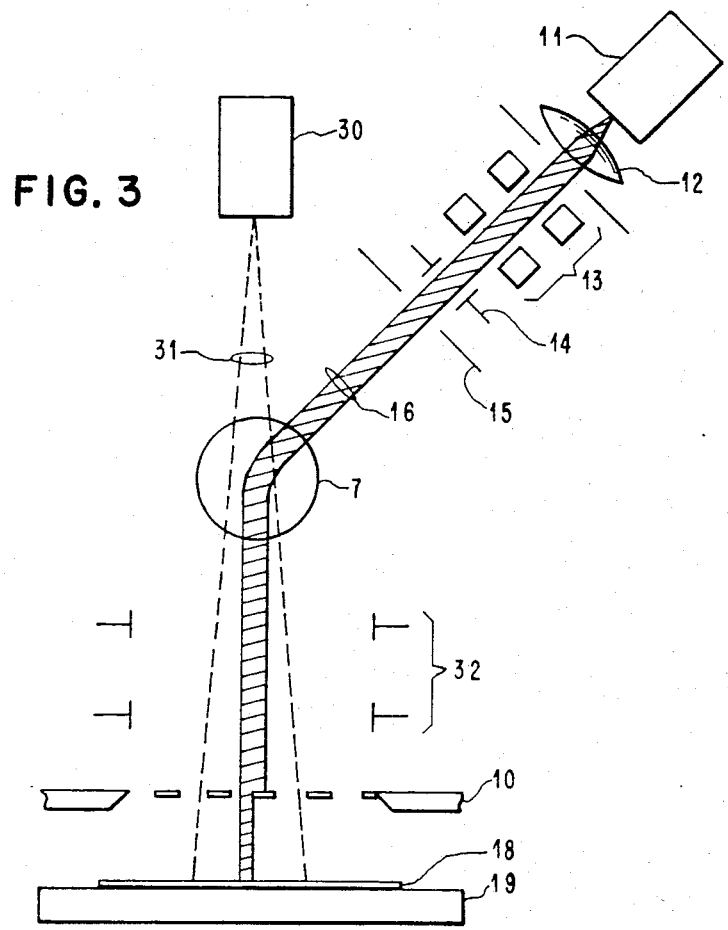
FIG. 3 is an X-ray projection printing device with coupled electron beam for alignment.

FIG. 3 is a schematic of a device for X-ray projection printing, wherein a mask 10 is projected onto a wafer 18 in one exposure step. The divergent X-ray beam 31 is generated in a standard X-ray source 30.

In this case, too, registration is effected by means of an electron beam 16 which by a magnetic field 7 extending perpendicularly to the paper plane is directed onto the axis of the X-ray beam 31. The means for generating the electron beam correspond to those of FIG. 1 and bear the same reference numbers. As X-rays are not deflected by magnetic and electric fields and there is no scanning of the mask, the raster scanning means 8 are eliminated with the system according to FIG. 3. An electrostatic deflector means 32 for tilting the electron beam during registration is also provided in this case. Registration errors detected are compensated for by realigning the wafer (e.g., by means of piezoelectric elements on the X-Y table 19) prior to X-radiation.

For calibrating the two beam paths 16 and 31 relative to each other, a maximum detector signal is generated first by means of X-ray illumination, moving means 21 with the X-Y table 19 to the appropriate position. Subsequently, the electron beam 16 is aligned with the aid of the beam alignment means 13. Apart from the missing X-ray deflection means, the X-ray lithography device of FIG. 3 corresponds to the ion beam lithography device of FIG. 1.

The exposure mask 10 for the registration method proposed herein must have a pattern of physical throughholes in the registration area R, as only these throughholes permit the electrons to pass without any difficulty. The actual pattern area M of the mask 10 on the other hand need not consist of a hole pattern, as suitably selected substances are transparent both for ion beams and X-rays. A preferred structure for the exposure mask 10 and the necessary manufacturing process will be described in detail below by means of FIGS. 4A to 4I.

Figure 4A:
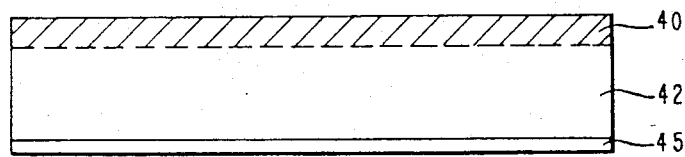
FIG. 4 are partial representations A to I of the manufacturing steps for a mask for X-ray projection printing.
Figure 4B:
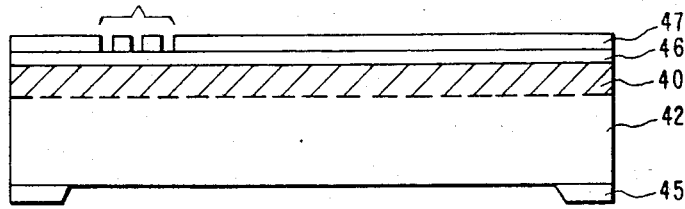
Figure 4C:
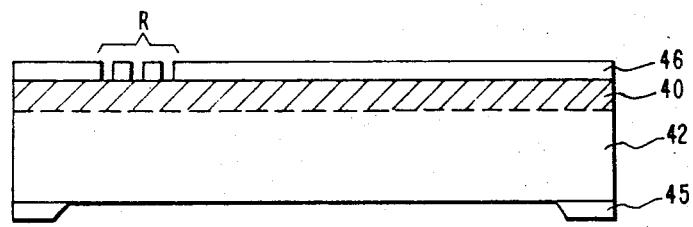
Figure 4D:
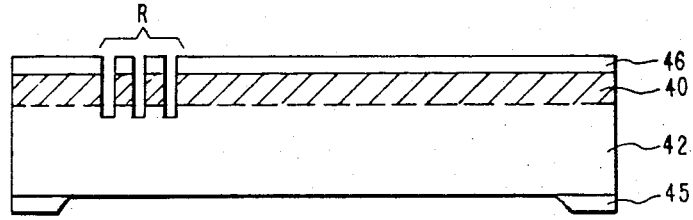
Figure 4E:
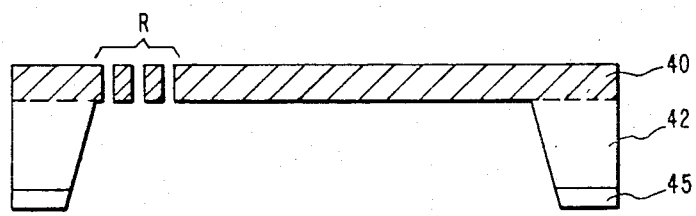
Figure 4F:
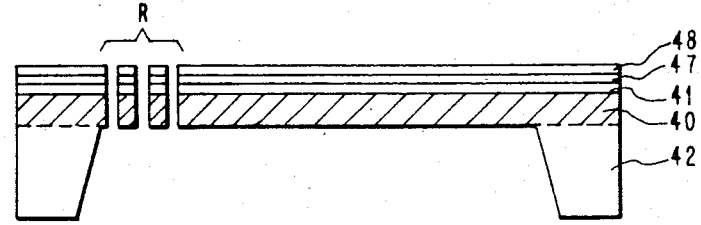
Figure 4G:
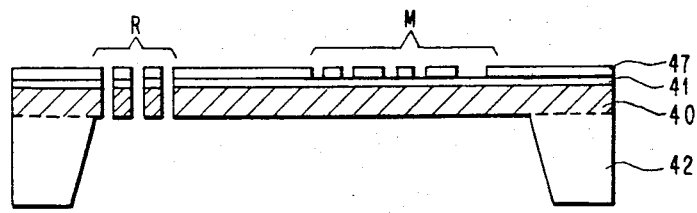
Figure 4H:
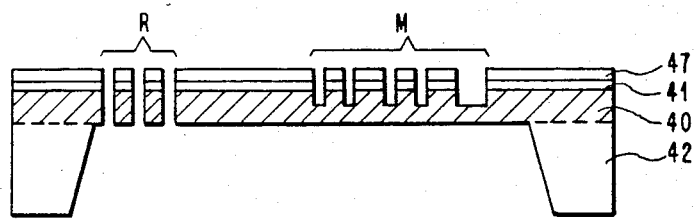
Figure 4I:
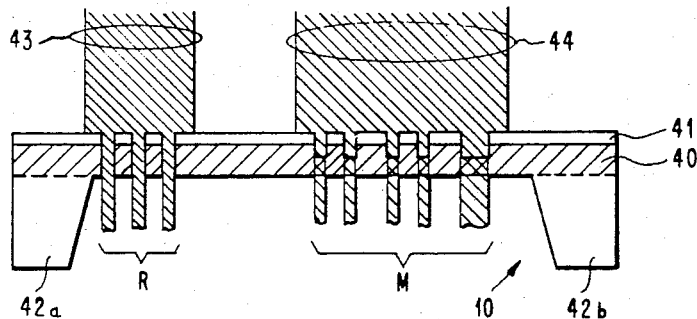

FIG. 4I shows the structure of the finished exposure mask 10 consisting of a thin silicon layer 40 with a thin gold layer 41. The thickness of layer 40 is several μm (e.g., 5 μm). This thin layer 40 is etched in selected areas from a silicon substrate, whose remaining parts are shown as supporting rims 42a, 42b, in FIG. 4I. In the thin layer there is a registration pattern R of throughholes, which pattern (during registration) is subjected to an electron beam 43, and the actual mask pattern M to which the ion beam or the X-ray 44 is directed during exposure. To enhance the contrast (reduction of scattering effects), the pattern area M consists of blind holes, so that in these places the residual thickness of the silicon layer 40 is only 25 percent of the normal value (about 1 to 2 μm). In spite of the high contrast for ion beam or X-ray exposure, silicon layer 40 has an excellent mechanical stability.

To increase further the contrast in ion beam lithography, the crystal orientation of the thin layer 40 is chosen to correspond to the crystallographic direction 100, so that the vertically incident ions are capable of passing the mask through lattice channels without any difficulties (this being known as channelling effect).

The registration pattern R is not only a prerequisite for the electron beam registration proposed here but may also be used for optical alignment methods to achieve a better contrast and to be independent of the carrier substrate used.

The individual steps for generating the exposure mask according to FIG. 4I are explained in FIG. 4A to 4H. According to FIG. 4A, a 100-crystal oriented silicon wafer 42 is boron-doped on its front side so that at a depth of about 5 μm the boron concentration is still about $7 \times 10^{19}$ atoms/cm$^3$ (layer 40). On the rear side of the wafer, an SiO$_2$ layer 45 with a thickness of about 1 μm is generated.

In FIG. 4B, a layer 46 of SiO$_2$ about 0.5 μm thick SiO$_2$ layer 46 is cathode sputtered onto the boron-doped front side, followed by an electron beam sensitive photoresist layer 47 about 0.5 μm thick. The hole pattern required in the registration area R is subsequently defined in the photoresist 47 (e.g., by means of a highly resolving electron beam scanner), and the photoresist is developed. A window of chip size is etched by conventional wet etching techniques into the SiO$_2$ layer 45 on the rear side.

In FIG. 4C the pattern of the photoresist corresponding to the registration area R is etched into the SiO$_2$ layer 46 in a first plasma etch process (Reactive Ion Etching RIE). For this purpose, it is possible, for example, to use a parallel plate reactor with CHF$_3$ as a reaction gas and a pressure of about 20 millitorr.

In FIG. 4D the structured SiO$_2$ layer 46 of FIG. 4C is used as a mask for a second plasma etch process, wherein by means of an Ar/Cl$_2$ plasma the hole pattern of the registration area M is etched into the boron-doped layer 40. The etch depth must be greater than the depth of the critical plane (marked by broken lines) in which the boron concentration is about $7 \times 10^{19}$ boron atoms/cm$^3$.

According to FIG. 4E, the silicon wafer 42 is subsequently anisotropically wet etched through the window in SiO$_2$ layer 45 until an etch stop occurs at a boron concentration of $7 \times 10^{19}$ boron atoms/cm$^3$. The etching solution having this property consists of ethylenediamine, pyrocatechin and water. Subsequently, the registration pattern M exists as a hole pattern in the thin silicon membrane 40. The actual exposure pattern M is defined in the silicon membrane 40 in the subsequent process steps.

After the SiO₂ layers 45 still remaining have been removed with buffered hydrofluoric acid according to FIG. 4F, an about 0.6 μm thick gold layer 41, an about 0.5 μm thick SiO₂ layer 47 and a photoresist layer 48 (<0.5 μm) are applied to the front side of the mask. During this, the structure of the registration area R is not changed.

In FIG. 4G the desired mask pattern is generated in the photoresist layer 49 by means of an electron beam scanner (pattern generator), for which purpose the electron beam can be simultaneously used to align this pattern to the hole pattern already available. After development of the photoresist, the mask pattern is again etched into the SiO₂ layer 47 by plasma etching. Subsequently, this layer serves as a mask for etching the gold layer 41 and silicon layer 40 by means of the above-metioned Ar/Cl₂ plasma. This etch process is controlled in such a manner that in the area of the exposure pattern M there are no throughholes but that about 25 percent of the doped silicon layer 40 are left over (FIG. 4H). In this manner it is also possible to produce masks with island-shaped structures which cannot be realized with throughholes and have to be split into complementary masks.

After etching of the pattern area M, the SiO₂ layer 47 is removed to obtain the final shape required for the exposure mask according to FIG. 4I. The gold layer 41 serves as an absorber layer for the ion beams as well as the X-rays.

Having thus described our invention, what we claim as new, and desire to secure by Letters Patent is:

1. In a system for exposing a substrate with respect to an alignment structure comprising
   said alignment structure including means for detecting alignment radiation,
   an exposure mask having a mask pattern thereon and a registration pattern thereon,
   said exposure mask being in adjacent relation and close proximity to said substrate,
   an electron beam means for generating electron beam alignment radiation adapted for use in detecting registration of said mask and said substrate,
   said electron beam means generating said electron beam for directing said alignment beam to pass through said registration pattern to said alignment structure whereby said means for detecting is energized by said alignment beam,
   said exposure mask with said registration pattern being adapted to be registered with said alignment structure on said substrate by passage of said electron beam through said registration pattern,
   an additional source of exposure rays other than an electron beam such as a source of x- or ion beam rays directed towards said exposure mask, said exposure rays being directed through said mask pattern,
   means for applying a magnetic field to bend said electron beam,
   said magnetic field extending perpendicularly to said electron beam whereby said electron beam is bent to extend collaterally to said exposure rays which extend towards said substrate.

2. In a system for exposing a substrate in accordance with claim 1,
   said mask being adapted for use in alignment with said electron beam alignment radiation,
   said mask having an alignment region and a separate exposure region,
   a patterned layer covering both said exposure region and said alignment region,
   said patterned layer being opaque to both x-rays and said electron beam alignment radiation,
   said patterned layer forming an alignment pattern in said alignment region and an exposure pattern in said exposure region,
   said patterned layer being supported by a thin x-ray transparent membrane in at least said exposure region,
   said supporting membrane being absent everywhere in said alignment region not covered by said alignment pattern to form holes through which alignment radiation may pass,
   whereby said supporting membrane may be opaque to said alignment radiation.

3. An apparatus in accordance with claim 1 including
   means for exposing a substrate through a mask by means of X-rays,
   and means for displacing said substrate relative to said mask as the correction required is determined during the alignment of said mask and said substrate.

4. An apparatus in accordance with claim 1 including
   said exposure system comprising an ion beam exposure system,
   including means for introducing both said ion beam and said electron beam
   into a magnetic field extending perpendicularly to the beam directions,
   said beams thus being collateral.

5. Apparatus in accordance with claim 1 including an X-ray exposure system,
   wherein magnetic field means for produce a magnetic field extending perpendicularly to said beam direction,
   whereby said electron beam is made collateral to the axis of said beam of X-rays.

6. An apparatus for mutually registering objects including
   a substrate and an exposure mask with an X- or ion exposure ray beam,
   means for providing an electron alignment beam extending partly collaterally to the path of said exposure beam for checking alignment of said object and said mask,
   means for detecting said electron beam,
   said electron beam passing through said mask to said means for detecting, and
   means for blanking said electron beam during the process of exposure of said substrate with said exposure ray beam.

7. An apparatus in accordance with claim 6, characterized in that the electron beam extends collaterally to the exposed beam path.

8. An apparatus in accordance with claim 7 for exposing said substrate through said mask by means of an ion beam, which ion beam can be tilted about a point lying in the plane of said mask,
   means for determining the necessary tilting angle,
   said angle being determined during the alignment of said mask and said substrate with the aid of said electron beam and reproduced by said ion beam during the subsequent exposure of said substrate with said ion beam.

9. An apparatus in accordance wih claim 6 including means for exposing said substrate through a mask by means of X-rays, and means for displacing said substrate relative to said mask as the correction required is determined during the alignment of said mask and said substrate.

10. An apparatus in accordance with claim 6 including said exposure system comprising an ion beam exposure system, including means for introducing both said ion beam and said electron beam into a magnetic field extending perpendicularly to the beam directions, said beams thus being collateral.

11. An apparatus in accordance with claim 7 wherein said exposure system comprises an ion beam exposure system, including means for introducing both said ion beam and said electron beam into a magnetic field extending perpendicularly to the beam directions, said beams thus being collateral.

12. An apparatus in accordance with claim 8 wherein said exposure system comprises an ion beam exposure system, including means for introducing both said ion beam and said electron beam into a magnetic field extending perpendicularly to the beam directions, said beams thus being collateral.

13. An apparatus in accordance with claim 3 including means for exposing a substrate through a mask by means of X-rays, and means for displacing said substrate relative to said mask as the correction required is determined during the alignment of said mask and said substrate.

14. Apparatus for in accordance with claim 7 wherein, in an X-ray exposure system, the electron beam is directed into the axis of the beam of X-rays by a magnetic field extending perpendicularly to the direction of said electron beam.

15. Apparatus for in accordance with claim 7 wherein in an X-ray exposure system, the electron beam is directed into the axis of the beam of X-rays by a magnetic field extending perpendicularly to the direction of said electron beam.

16. Apparatus for in accordance with claim 7 wherein in an X-ray exposure system, the electron beam is directed into the axis of the beam of X-rays by a magnetic field extending perpendicularly to the direction of said electron beam.

17. Apparatus for exposing a substrate to x-ray or ion exposure beam through a mask, including means for supporting said mask and said substrate with respect to exposure means comprising an X- or ion ray exposure beam source, said x-ray or ion ray beam source being aimed to direct an exposure beam through said mask to said substrate, means for checking alignment of said mask with respect to said substrate comprising an electron beam, means for sensing said electron beam located beneath said mask, and said electron beam being directed collaterally to said exposure beam path.

18. Apparatus in accordance with claim 17 wherein said exposure beam comprises an ion beam which is adapted to being tilted about a point lying in the mask plane, said mask including a registration area, said electron beam being directed towards said registration area for determining the angle of tilt for said electron beam and said ion beam, and said apparatus including magnetic field means producing a magnetic field directed perpendicularly to said ion beam and said electron beam for tilting said ion beam and said electron beam through angles which result in collateral alignment of said electron and ion beams.

19. Apparatus in accordance with claim 17 wherein detector means being provided for checking the relative inclination of said exposure beam and said electron beam, and means for adjusting said inclination of said electron beam, whereby optima of detector signals can be produced when said exposure beam and said electron beam have equal inclinations.

20. Apparatus in accordance with claim 17 with said mask including a pattern of holes for registration, said means for sensing said electron beam being located beneath said mask, and including a stationary detector mask with a pattern of holes which is identical with a hole pattern for registration in said mask.

21. A mask for X-ray or ion exposure radiation for use with alignment radiation directed collaterally towards said mask for proper alignment of said mask prior to application of said exposure radiation thereto, said mask having an alignment region and a separate exposure region, a patterned layer covering both said exposure region and said alignment region, said patterned layer being opaque to said exposure radiation and said alignment radiation, said patterned layer forming an alignment pattern in said alignment region and an exposure pattern in said exposure region, said patterned layer being supported by a thin X-ray transparent membrane in at least said exposure region, said supporting membrane being absent everywhere in said alignment region not covered by said alignment pattern to form holes through which alignment radiation may pass, whereby said supporting membrane may be opaque to said alignment radiation, and said alignment radiation may pass collaterally to said exposure radiation through said mask where said membrane is absent.

22. Apparatus in accordance with claim 21 wherein said mask comprises a thin silicon layer, said registration region being separated from said exposure region, said registration region having throughholes through said silicon layer for passage of said alignment radiation therethrough.

23. Apparatus in accordance with claim 22 wherein said patterned area has blind holes formed in said silicon layer, said patterned area with said blind holes, while being opaque to said alignment radiation and providing support for said patterned layer, is transparent to said exposure radiation, and said blind holes being formed in said silicon.

* * * * *